United States Patent
Ozawa

(10) Patent No.: US 10,431,553 B2
(45) Date of Patent: Oct. 1, 2019

(54) SEMICONDUCTOR DEVICE AND MANUFACTURING METHOD OF SEMICONDUCTOR DEVICE

(71) Applicant: LAPIS Semiconductor Co., Ltd., Yokohama (JP)

(72) Inventor: Azusa Ozawa, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 16/179,109

(22) Filed: Nov. 2, 2018

(65) Prior Publication Data

US 2019/0081006 A1 Mar. 14, 2019

Related U.S. Application Data

(63) Continuation of application No. 15/658,822, filed on Jul. 25, 2017, now Pat. No. 10,157,853.

(30) Foreign Application Priority Data

Jul. 27, 2016 (JP) ................. 2016-147676

(51) Int. Cl.
*H01L 23/544* (2006.01)
*H01L 23/48* (2006.01)
(Continued)

(52) U.S. Cl.
CPC .......... *H01L 23/544* (2013.01); *G03F 9/7084* (2013.01); *G03F 9/7088* (2013.01); *H01L 21/76224* (2013.01); *H01L 21/76898* (2013.01); *H01L 23/481* (2013.01); *H01L 23/5226* (2013.01); *H01L 29/0649* (2013.01); *H01L 24/03* (2013.01); *H01L 24/05* (2013.01); *H01L 24/11* (2013.01); *H01L 24/13* (2013.01); *H01L 2223/54426* (2013.01); *H01L 2223/54453* (2013.01); *H01L 2224/02371* (2013.01); *H01L 2224/05548* (2013.01);
(Continued)

(58) Field of Classification Search
CPC ....................... H01L 21/76898; H01L 23/544
See application file for complete search history.

(56) References Cited

U.S. PATENT DOCUMENTS

2016/0190041 A1 6/2016 Gong et al.
2017/0033052 A1* 2/2017 Koketsu ................ H01L 23/544

FOREIGN PATENT DOCUMENTS

| JP | 2004-356316 A | 12/2004 |
| JP | 2009-147317 A | 7/2009 |

* cited by examiner

*Primary Examiner* — Daniel P Shook

(74) *Attorney, Agent, or Firm* — Rabin & Berdo, P.C.

(57) ABSTRACT

A semiconductor device includes a semiconductor substrate having a first surface, which includes an element forming region and an element isolation region, and a second surface opposite to the first surface, a semiconductor element formed on the semiconductor substrate in the element forming region, an insulator formed on the semiconductor substrate in the element isolation region, a first wiring layer formed on the first surface of the semiconductor substrate, the first wiring layer being connected to the semiconductor element, an alignment mark formed on the semiconductor substrate in the element isolation region, the entire alignment mark overlapping with the insulator in a plan view of the semiconductor device, and a second wiring layer formed on the second surface of the semiconductor substrate.

4 Claims, 15 Drawing Sheets

(51) Int. Cl.
*H01L 23/522* (2006.01)
*G03F 9/00* (2006.01)
*H01L 21/762* (2006.01)
*H01L 21/768* (2006.01)
*H01L 29/06* (2006.01)
*H01L 23/00* (2006.01)

(52) U.S. Cl.
CPC . *H01L 2224/05647* (2013.01); *H01L 2224/11* (2013.01); *H01L 2224/11462* (2013.01); *H01L 2224/131* (2013.01); *H01L 2224/13022* (2013.01); *H01L 2224/13024* (2013.01)

SEMICONDUCTOR DEVICE AND MANUFACTURING METHOD OF SEMICONDUCTOR DEVICE

CROSS-REFERENCE TO RELATED APPLICATIONS

This application is a continuation of U.S. application Ser. No. 15/658,822, filed on Jul. 25, 2017, and allowed on Jul. 31, 2018, which is based upon and claims the benefit of priority from Japanese Patent Application No. 2016-147676, filed on Jul. 27, 2016. The entire disclosures of these prior U.S. and foreign applications are incorporated herein by reference.

BACKGROUND OF THE INVENTION

Technical Field

The present invention relates to a semiconductor device and a manufacturing method for a semiconductor device.

Background Arts

TSV (through-silicon via), which is one of the semiconductor packaging technology, is used to connect a wiring layer formed on the front surface and the rear surface of a semiconductor substrate to each other, or to connect top and bottom chips to each other in a package formed by stacking a plurality of semiconductor chips, for example.

Known examples of the process method to form the through-silicon via include the via-first method, the via-middle method, and the via-last method. The via-first method is to form a through-silicon via before forming a semiconductor element on a semiconductor substrate. The via-middle method is to form a through-silicon via after a semiconductor element is formed on a semiconductor substrate but before a wiring layer is formed on the element forming surface. The via-last method is to form a through-silicon via after a semiconductor element is formed on a semiconductor substrate and a wiring layer is formed on the element forming surface.

In the via-last method among the three methods, the process to form a through-silicon via includes a step of forming a through-hole reaching from a surface of the semiconductor substrate opposite to the element forming surface (will be referred to as the rear surface below) to the element forming surface. The location of the through-hole needs to align with the wiring layer on the element forming surface of the semiconductor substrate, and therefore, it is important to correctly position a mask used for an etching process to form the through-hole.

In recent years, the technology is used in which infrared is radiated from the rear surface side of the semiconductor substrate so as to recognize an alignment mark formed on the element forming surface of the semiconductor substrate by receiving the reflected light or transmission light, and the mask is correctly positioned on the rear surface of the semiconductor substrate based on this alignment mark.

For example, Japanese Patent Application Laid-open Publication No. 2009-147317 (Patent document 1) describes the positioning method using a photolithography apparatus including: guiding infrared radiation onto an alignment mark, passing through at least a part of a substrate; detecting the infrared radiation reflected by the alignment mark using a non-imaging detector; and measuring the position of the alignment mark using the detected infrared radiation.

STI (shallow trench isolation) is known as a method to electrically separate respective semiconductor elements formed on a semiconductor substrate. In this STI method, a trench is formed on the surface of the semiconductor substrate, an insulating film is formed on the semiconductor substrate so as to fill the trench, and the surface of this insulating film is planarized. It is known that if the trench is too wide, "dishing," which means the center of the insulating film being lowered due to the planarization, occurs. In order to prevent this dishing, a dummy pattern to expose a base material of the semiconductor substrate is formed in an island shape in an insulating film (field oxidization film) formed in the element isolation (separation) region as described in Japanese Patent Application Laid-open Publication No. 2004-356316, for example.

SUMMARY OF THE INVENTION

Patent Document 1 above describes that a dopant doped into the silicon substrate may diffuse the infrared radiated to recognize the alignment mark. In order to solve this problem, Patent Document 1 describes the method to prevent the dopant from being doped into the silicon near the alignment mark by placing a resist above the alignment mark. Specifically, a patterning device is configured such that the area overlapping the alignment mark is not exposed to a projection radiation beam (or such that the area is exposed to the projection radiation beam, depending on whether the resist is a negative resist or a positive resist) during the photolithography.

However, with this method, it is necessary to form a resist in a position corresponding to the alignment mark every time the dopant is to be doped. The resist used for the dopant implantation can be either a positive type or a negative type, and therefore, if the resist needs to be formed in a position corresponding to the alignment mark every time the dopant is to be doped, the mask design would be very complex. Also, because it is difficult to confirm the area where the dopant is doped with a non-destruction test, even if the dopant is doped near the alignment mark due to an improper mask design, the error in the mask design cannot be detected pre-process of semiconductor manufacturing of forming the semiconductor element is started. In this case, the error in the mask design would not be discovered until infrared is radiated from the rear surface of the silicon substrate to recognize the alignment mark on the element forming surface in the process of forming the through-hole after the semiconductor element has been formed. This could result in a problem of prolonged development period of a product.

The present invention was made in view of those problems, and an object thereof is to suppress an error in recognizing an alignment mark caused by the diffusion of infrared light, without requiring a complex mask design.

According to one aspect of the present invention, a semiconductor device includes a semiconductor substrate having a first surface, which includes an element forming region and an element isolation region, and a second surface opposite to the first surface, a semiconductor element formed on the semiconductor substrate in the element forming region, an insulator formed on the semiconductor substrate in the element isolation region, a first wiring layer formed on the first surface of the semiconductor substrate, the first wiring layer being connected to the semiconductor element, an alignment mark formed on the semiconductor substrate in the element isolation region, the entire alignment mark overlapping with the insulator in a plan view of the semiconductor device, and a second wiring layer formed on the second surface of the semiconductor substrate.

According to another aspect of the present invention, a manufacturing method of a semiconductor device, includes providing a semiconductor substrate, the semiconductor substrate having a first surface, which includes an element forming region and an element isolation region, and a second surface opposite to the first surface, forming an insulator in the element isolation region of the semiconductor substrate, forming a semiconductor element in the element forming region of the semiconductor substrate, forming a first wiring layer on the first surface of the semiconductor substrate, and connecting the first wiring layer to the semiconductor element, forming an alignment mark, the alignment mark being so arranged that the entire alignment mark overlaps with the insulator in a plan view of the semiconductor device, and forming a second wiring layer on the second surface of the semiconductor substrate.

The present invention is aiming at suppressing an error in recognizing an alignment mark caused by the diffusion of infrared light, without requiring a complex mask design.

DETAILED DESCRIPTION OF THE INVENTION

Figure 1:
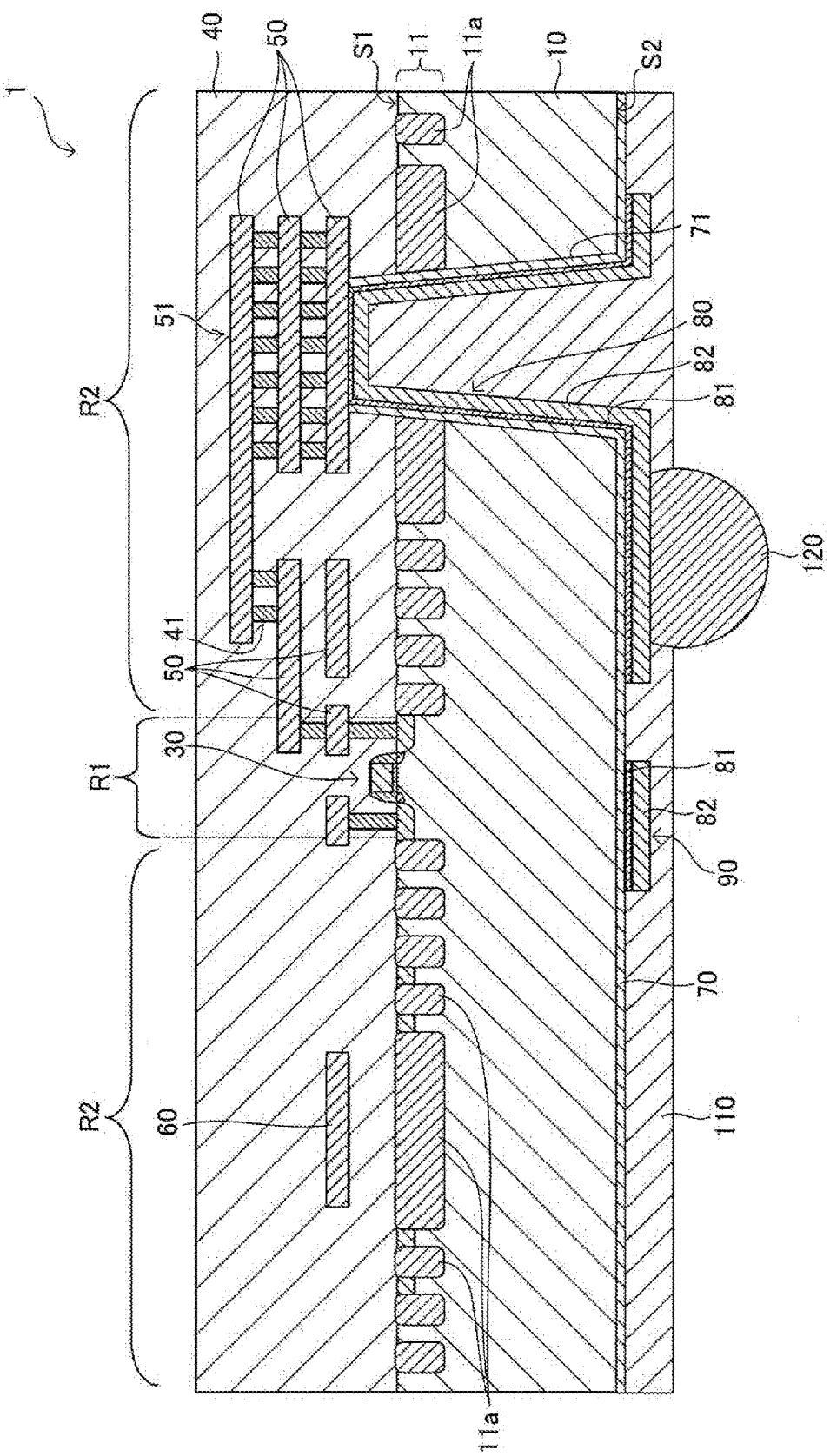
FIG. 1 is a cross-sectional view showing the configuration of a semiconductor device of an embodiment of the present invention.

Embodiments of the disclosed technology will be explained below with reference to figures. In the respective figures, constituting elements or parts that are identical or equivalent to each other are given the same reference characters.

Embodiment 1

FIG. 1 is a cross-sectional view showing the configuration of a semiconductor device 1 of Embodiment 1 of the present invention. The semiconductor device 1 includes a semiconductor substrate 10 having an element forming region R1 and an element isolation region (field region) R2. The element forming region R1 is an area where semiconductor elements such as a transistor and resistance element are formed. FIG. 1 shows a MOSFET (metal-oxide-semiconductor field-effect transistor) 30 as an example of the semiconductor element formed in the element forming region R1. Although FIG. 1 shows one element forming region R1, the semiconductor device 1 can include a plurality of element forming regions R1.

The element isolation region R2 is an area to electrically separate a plurality of element forming regions R1. In the element isolation region R2, an insulator layer 11 including an insulator 11a such as SiO$_2$ is formed at the top layer of the element forming surface S1 of the semiconductor substrate 10. The insulator layer 11 is also referred to as a field oxide film, and has the STI (shallow trench isolation) structure, for example.

The semiconductor device 1 has a first wiring layer 50 that covers the element forming surface S1 of the semiconductor substrate 10. The first wiring layer 50 includes a circuit wiring connected to the semiconductor element (MOSFET 30) formed in the element forming region R1. The first wiring layer 50 may have a multi-layer structure as shown in FIG. 1. Each layer of the stacked structure is insulated by the insulating film 40 covering the element forming surface S1 of the semiconductor substrate 10 in some areas, and is connected to another layer through a via 41 in other areas.

The semiconductor device 1 has a second wiring layer 90 that covers the rear surface S2 opposite to the element forming surface S1. The second wiring layer 90 is connected to the first wiring layer 50 by a through-silicon via 80 that penetrates through the semiconductor substrate 10. The second wiring layer 90 is also referred to as re-wiring line. In this embodiment, the through-silicon via 80 is formed by the via-last method. That is, the through-silicon via 80 is formed by forming a through-hole reaching from the rear surface S2 of the semiconductor substrate 10 to the first wiring layer 50 after the semiconductor element such as MOSFET 30 and the first wiring layer 50 are formed on the element forming surface S1 of the semiconductor substrate 10, and forming a conductive film 82 formed of a conductor such as Cu covering the side face and the bottom face of this through-hole. The second wiring layer 90 is formed of the same conductive film 82 as that forming the through silicon via 80. The through silicon via 80 is formed in the element isolation region R2 of the semiconductor substrate 10.

Between the semiconductor substrate 10 and the second wiring layer 90, and between the semiconductor substrate 10 and the through silicon via 80, insulating films 70 and 71 made of an insulator such as SiO$_2$ are respectively formed so that the semiconductor substrate 10 is electrically isolated from the second wiring layer 90 and the through-silicon via 80. An underlying film 81 of the second wiring layer 90 and the through-silicon via 80 includes a barrier metal film. The barrier metal film has the function of preventing the conductor material (such as Cu) used to form the through silicon via 80 and the second wiring layer 90 from contaminating the semiconductor substrate 10.

On the rear surface S2 of the semiconductor substrate 10, a solder resist 110 is formed to cover the second wiring layer 90 and to fill a through-hole formed in the process to form the through-silicon via 80. A soldering bump 120, which functions as the external connecting terminal, is connected to the second wiring layer 90.

When the through silicon via 80 is formed by the via-last method as described above, a through-hole is formed so as to reach from the rear surface S2 of the semiconductor substrate 10 to the first wiring layer 50. The position of the through-hole needs to align with the first wiring layer 50 formed on the element forming surface S1 of the semiconductor substrate 10. That is, the position of the through-hole needs to align a pad 51 formed in the first wiring layer 50. In this embodiment, using an alignment mark 60 formed in a layer where the first wiring layer 50 is formed as the reference for the positioning, the position of the through-hole can be correctly aligned to the first wiring layer 50. The alignment mark 60 is recognized by radiating infrared from the direction of the rear surface S2 of the semiconductor substrate 10 toward the alignment mark 60, and receiving the reflection light or transmission light thereof. The alignment mark 60 can also be used to align the second wiring layer 90 to the first wiring layer 50.

Figure 2A:
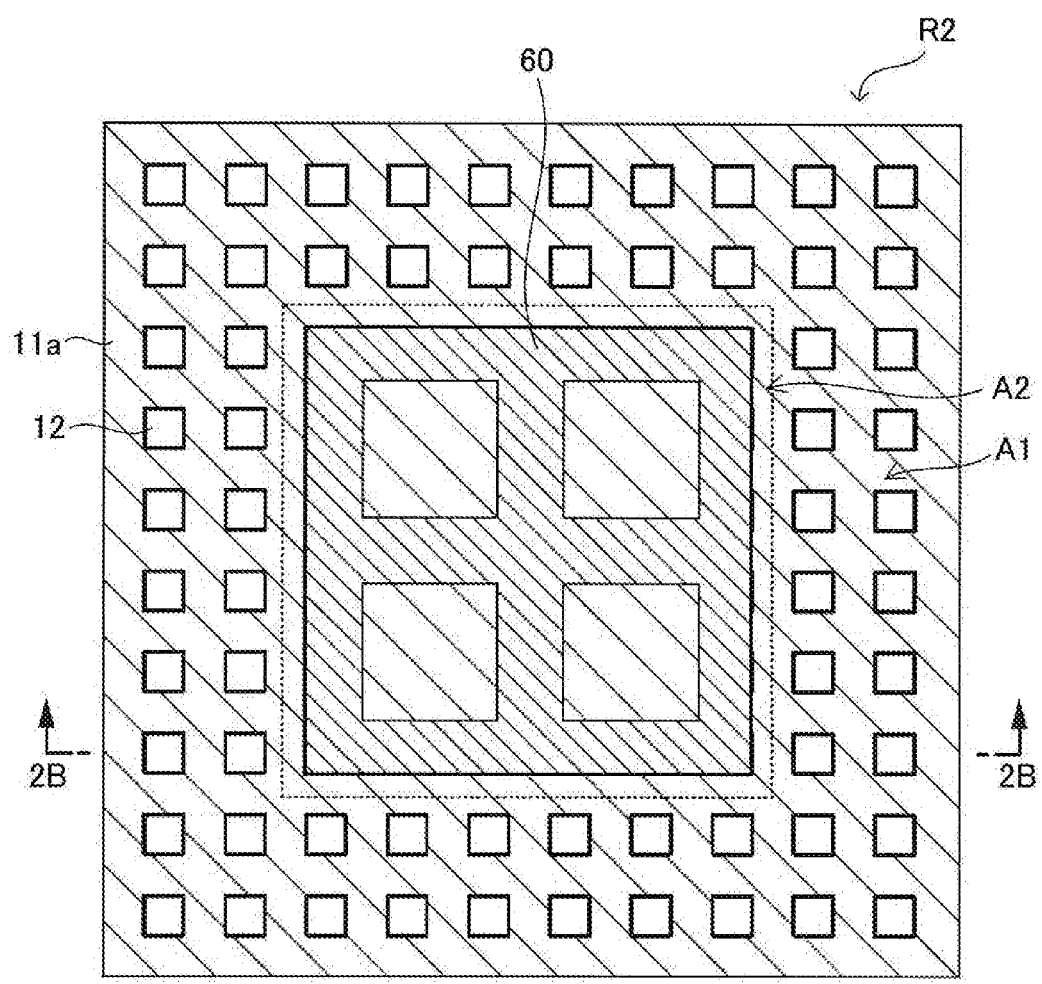
FIG. 2A is a plan view showing the configuration of an area near the alignment mark of a semiconductor device of an embodiment of the present invention.
Figure 2B:
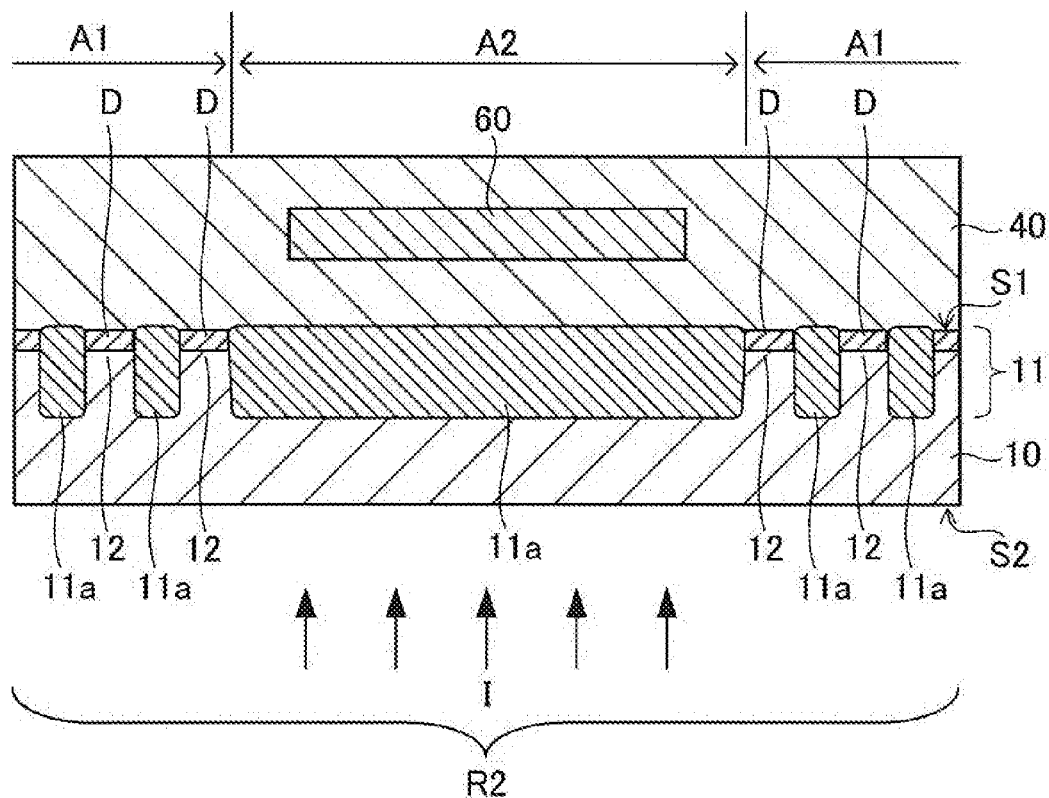
FIG. 2B is a cross-sectional view along the line 2B-2B in FIG. 2A.

FIG. 2A is a plan view showing the configuration near the alignment mark 60 of the semiconductor device 1, and FIG. 2B is a cross-sectional view along the line 2B-2B of FIG. 2A. FIG. 2A does not show the insulating film 40.

In this embodiment, the alignment mark 60 is formed in the layer where the first wiring layer 50 is formed, and is formed of the same conductor as the first wiring layer 50. There is no limitation on the size or shape of the alignment mark 60, and the alignment mark 60 may have the grid shape as shown in FIG. 2A, for example, and the length of each side may be about 100 μm, for example. The alignment mark 60 is formed in a position corresponding to the element isolation region R2 of the semiconductor substrate 10. As described below, the alignment mark 60 may be formed in a scribe region in the element isolation region R2.

The insulator layer (field oxide film) 11 formed in the element isolation region R2 has the STI structure formed using the STI method. That is, the insulator layer 11 is formed by forming a trench in the element forming surface S1 of the semiconductor substrate 10, filling the trench with an insulator such as SiO$_2$, and planarizing the surface of the insulator with the CMP (chemical mechanical polishing) method. When the area of the insulator 11a that forms the insulator layer 11 gets larger, a problem called "dishing" occurs due to the difference between the polishing rate of the silicon nitride film (Si$_3$N$_4$) used for a stopper film of the polishing process performed in the CMP process and the polishing rate of the insulator (SiO$_2$) 11a forming the insulator layer 11. "Dishing" is the phenomenon where the center part of the front surface of the insulator layer 11 has a dish-like recess. When this "dishing" occurs, the flatness of the element forming surface S1 of the semiconductor substrate 10 is adversely affected, which makes it difficult to form the first wiring layer 50. As shown in FIGS. 2A and 2B, in order to prevent "dishing," a dummy active region (dummy section) 12 that exposes the base material (silicon of the semiconductor substrate 10) is formed in an island shape in the insulating layer 11. By providing a plurality of dummy active regions 12 in the insulator layer 11 in the element isolation region R2, the occurrence of "dishing" can be prevented.

As shown in FIGS. 2A and 2B, the element isolation region R2 includes a first area A1 where a plurality of dummy active regions 12 are formed, and a second area A2 where the dummy active region is not formed in a part near the alignment mark 60. In FIG. 2A, an inner area of the region enclosed by the broken line is the second area A2, and an area outside of the region enclosed by the broken line is the first area A1. In the second area A2, the surface of the semiconductor substrate 10 is completely covered by the insulator 11a. The alignment mark 60 is formed in the area inside of the second region A2 completely covered by the insulator 11a. That is, the projection area of the alignment mark 60 in the direction vertical to the primary surfaces (element forming surface S1 and the rear surface S2) of the semiconductor substrate 10 does not overlap any of the plurality of dummy active regions 12.

Figure 3A:
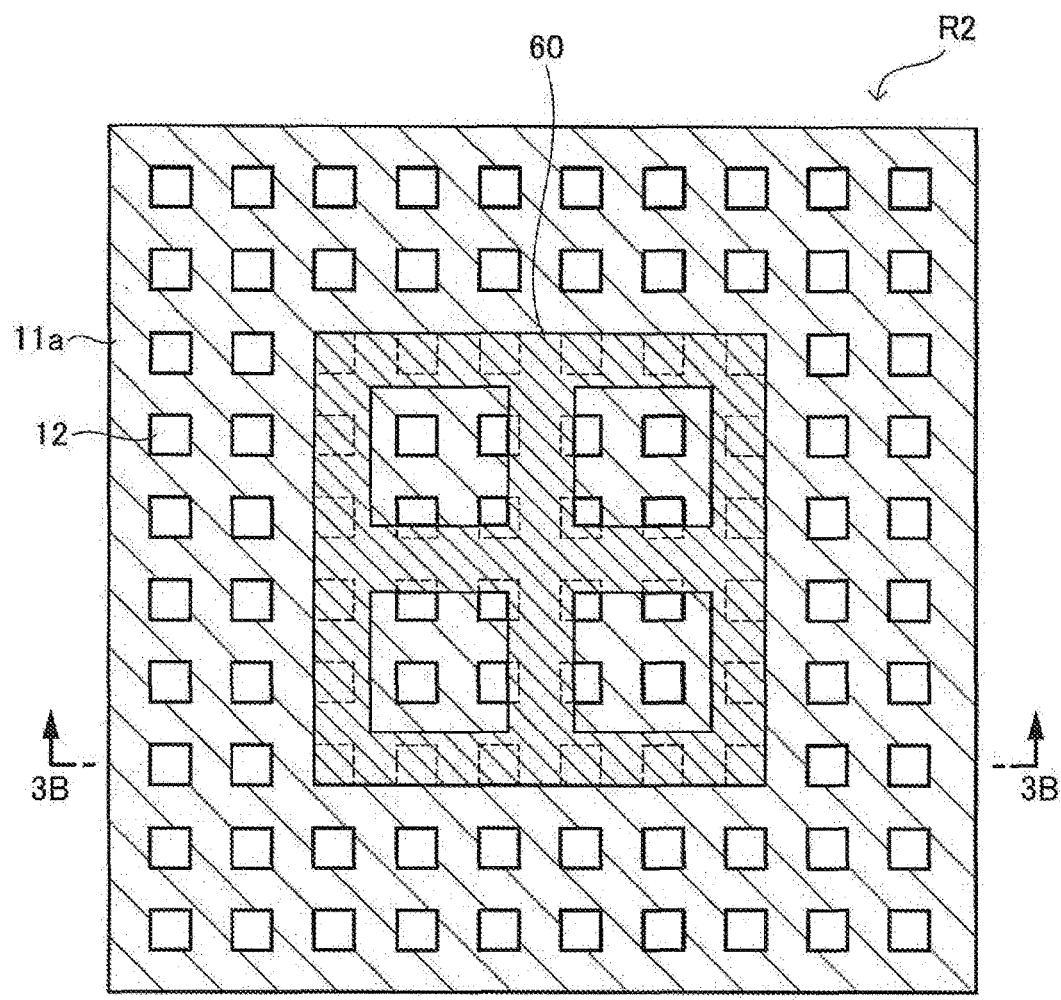
FIG. 3A is a plan view showing a related art of the configuration of the area near the alignment mark.
Figure 3B:
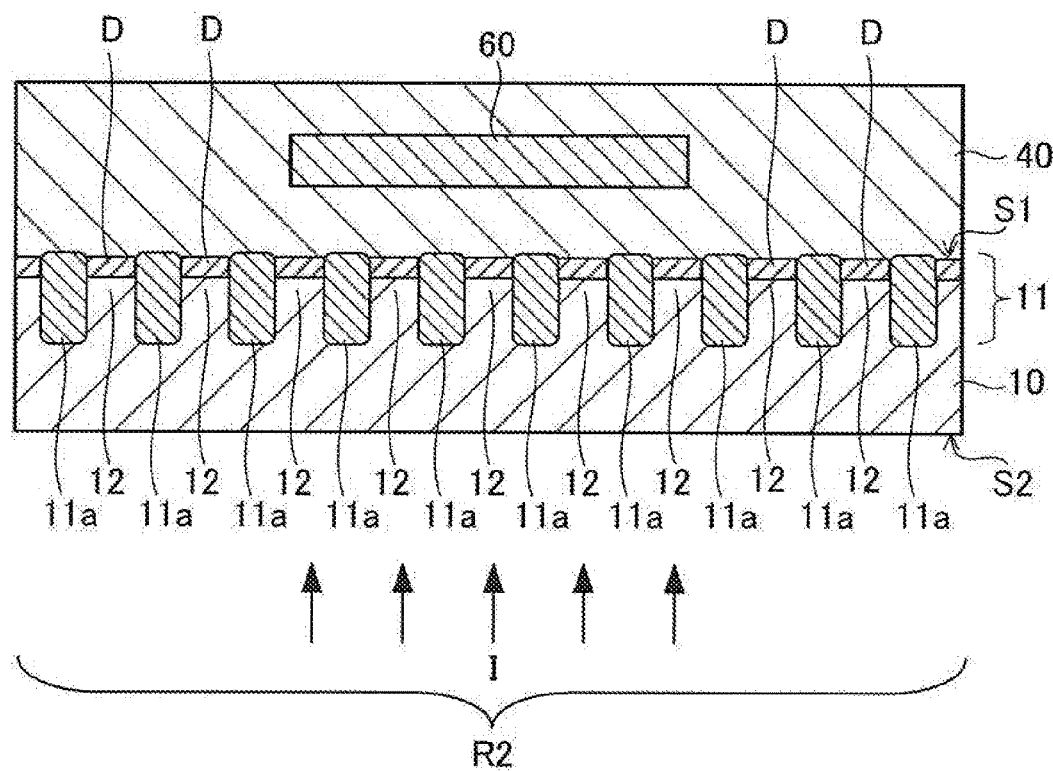
FIG. 3B is a cross-sectional view along the line 3B-3B in FIG. 3A.

FIG. 3A is a plan view showing a related art of the configuration near the alignment mark 60, and FIG. 3B is a cross-sectional view along the line 3B-3B of FIG. 3A. In the related art shown in FIGS. 3A and 3B, the plurality of dummy active regions 12 are disposed evenly throughout the entire area of the element isolation region R2, and therefore, the alignment mark 60 has a part that overlaps the dummy active regions 12. The dopant doped into the semiconductor substrate 10 in the process of forming the semiconductor element in the element forming region R1 is sometimes doped into the dummy active regions 12. With the configuration of the related art shown in FIGS. 3A and 3B, there is a dummy active region 12 doped with the dopant D immediately below the alignment mark 60. It is known that infrared is diffused by the dopant doped into silicon. Thus, the infrared I radiated from the rear surface S2 of the semiconductor substrate 10 toward the alignment mark 60 in order to recognize the alignment mark 60 is diffused by the dopant D in the dummy active region 12, which could cause erroneous recognition of the alignment mark 60.

The inventor of the present invention has found that dopant doped into an insulator does not diffuse infrared, and the semiconductor device 1 of this embodiment was made based on this finding. As shown in FIGS. 2A and 2B, in the semiconductor device 1 of this embodiment, the alignment mark 60 is formed in an area within the second area A2 of the insulating layer 11, which is completely covered by the insulator 11a, and the projection area of the alignment mark 60 in the direction vertical to the primary surfaces of the semiconductor substrate 10 does not overlap any of the plurality of dummy active regions 12. Therefore, the infrared I radiated from the rear surface S2 of the semiconductor substrate 10 toward the alignment mark 60 in order to recognize the alignment mark 60 passes through the insulator 11a that extends in the second area A2, not the dummy active regions 12 doped with the dopant D. This allows the infrared I to reach the alignment mark 60 without being diffused. As a result, the alignment mark 60 can be property recognized, and erroneous recognition of the alignment mark 60 can be suppressed.

Next, one example of the manufacturing method of the semiconductor device 1 of an embodiment of the present invention will be explained. First, the processes on the element forming surface S1 of the semiconductor substrate 10 will be explained with reference to FIGS. 4A to 4K.

Figure 4A:
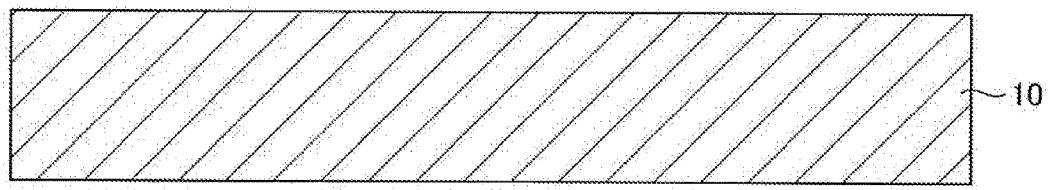
FIG. 4A is a cross-sectional view showing a manufacturing method of a semiconductor device of an embodiment of the present invention.
Figure 4B:
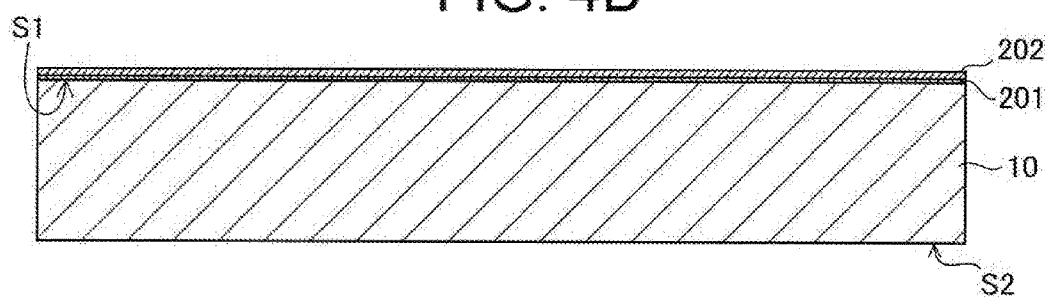
FIG. 4B is a cross-sectional view showing a manufacturing method of a semiconductor device of an embodiment of the present invention.

First, a semiconductor substrate 10 formed of a semiconductor such as silicon is prepared (FIG. 4A). Next, a silicon oxide film ($SiO_2$ film) 201 is formed so as to cover the element forming surface S1 of the semiconductor substrate 10, using a known thermal oxidization method. Next, a silicon nitride film ($Si_3N_4$ film) 202 is formed so as to cover the silicon oxide film 201, using a known CVD (chemical vapor deposition) method (FIG. 4B).

Figure 4C:
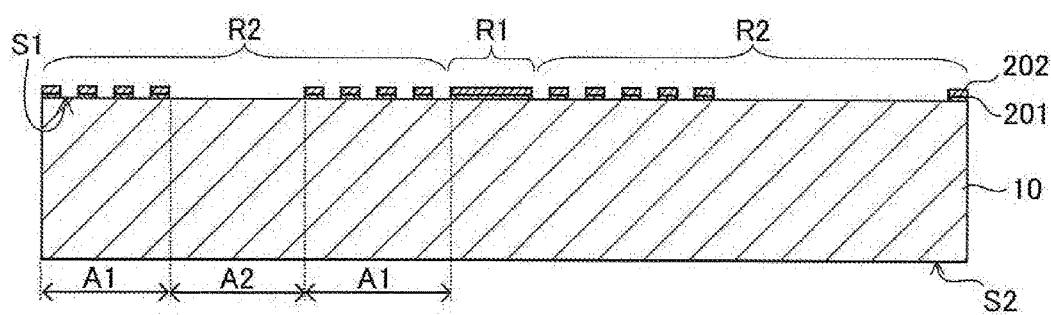
FIG. 4C is a cross-sectional view showing a manufacturing method of a semiconductor device of an embodiment of the present invention.

Next, the silicon oxide film 201 and the silicon nitride film 202 are patterned using known photolithography technique and etching technique. The silicon oxide film 201 and the silicon nitride film 202 are patterned into a shape corresponding to the pattern of the insulator layer (field oxide film) 11 including dummy active regions formed in the element isolation region R2. In the second area A2 (see FIGS. 2A and 2B) that includes the alignment mark 60, which is formed in the process described below, the silicon oxide film 201 and the silicon nitride film 202 are removed (FIG. 4C).

Figure 4D:
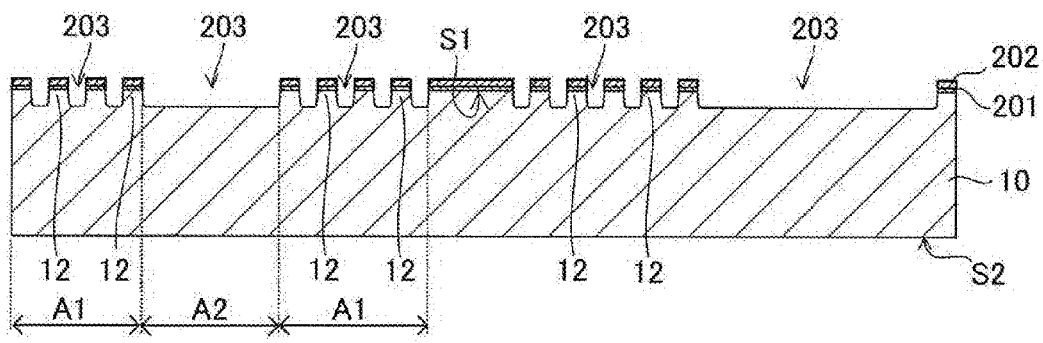
FIG. 4D is a cross-sectional view showing a manufacturing method of a semiconductor device of an embodiment of the present invention.

Next, a trench 203 is formed in the element isolation region R2 of the semiconductor substrate 10. The trench forming process includes an etching process, and the silicon oxide film 201 and the silicon nitride film 202 are used as a mask in the etching process. As explained above, the element isolation region R2 includes the first area A1 and the second area A2. The trench 203 is formed in the second area A2 that includes the alignment mark 60, which is formed in the process described below, and by arranging the areas that do not have the trench in an island shape, a plurality of dummy active regions 12 are formed in the first area A1 adjacent to the second area A2 (FIG. 4D).

Figure 4E:
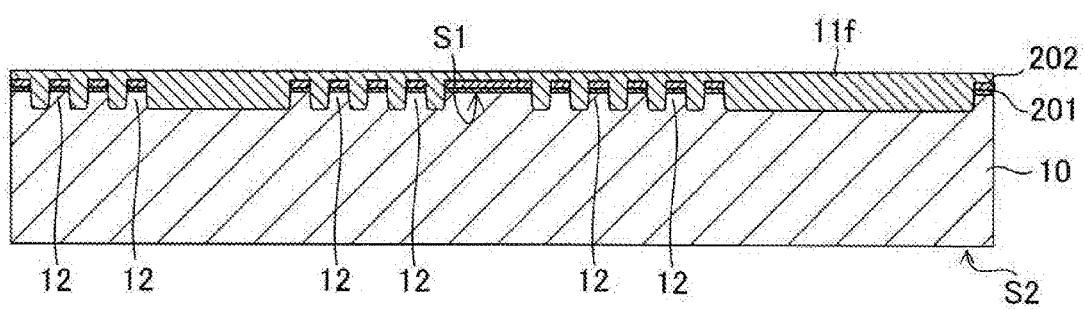
FIG. 4E is a cross-sectional view showing a manufacturing method of a semiconductor device of an embodiment of the present invention.

Next, using a known CVD method, an insulating film 11$f$ made of an insulator such as $SiO_2$ is formed so as to cover the element forming surface S1 of the semiconductor substrate 10. The insulating film 11$f$ is formed to have a thickness that covers the top surface of the silicon oxide film 201 and the silicon nitride film 202. The trench 203 formed in the previous process is filled with the insulating film 11$f$ (FIG. 4E).

Figure 4F:
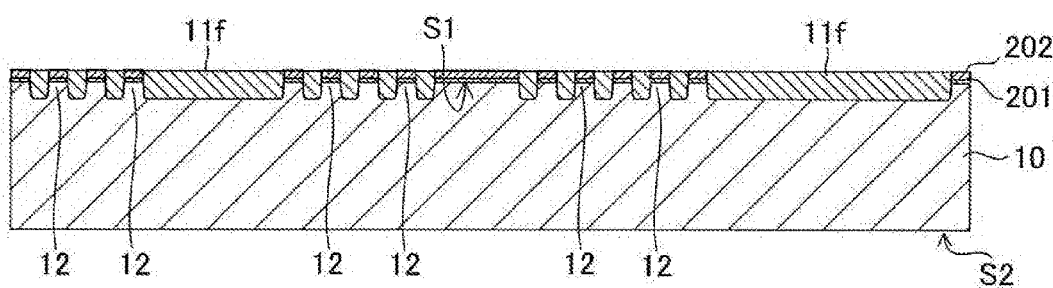
FIG. 4F is a cross-sectional view showing a manufacturing method of a semiconductor device of an embodiment of the present invention.

Next, using a known CMP method, the insulating film 11$f$ is planarized. In the planarization process by the CMP method, the insulating film 11$f$ is polished using a polishing liquid (slurry). The silicon nitride film 202 functions as a stopper film in this polishing process. By forming the dummy active regions 12 in the element isolation region R2, it is possible to prevent the surface of the insulating film 11$f$ from having a recess (dishing) after the polishing process (FIG. 4F).

Figure 4G:
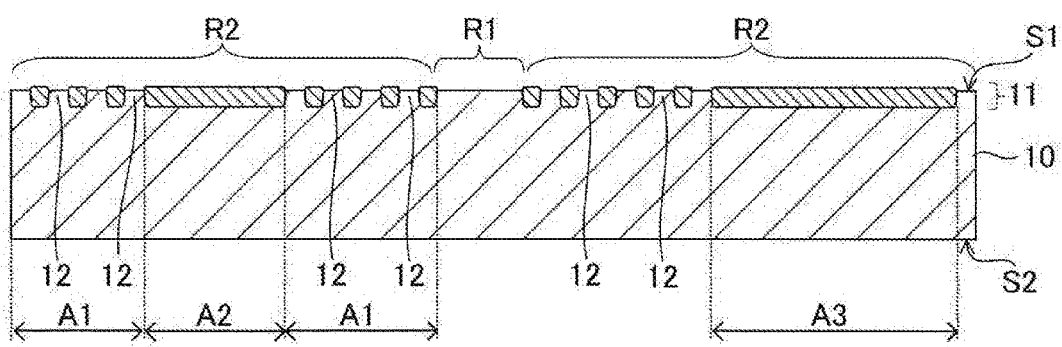
FIG. 4G is a cross-sectional view showing a manufacturing method of a semiconductor device of an embodiment of the present invention.

Next, the silicon oxide film 201 and the silicon nitride film 202 are removed by the etching process. Through those processes, the insulator layer (field oxide film) 11 including the dummy active regions 12 is formed at the top layer of the element forming surface S1 in the element isolation region R2 of the semiconductor substrate 10 (FIG. 4G). The dummy active regions are not formed in the second area A2 that includes the alignment mark 60 formed in the process described below, and the second area A2 is covered by the insulator. It is also preferable that an area A3 where the through-silicon via 80 is to be formed through do not have dummy active regions formed therein.

Figure 4H:
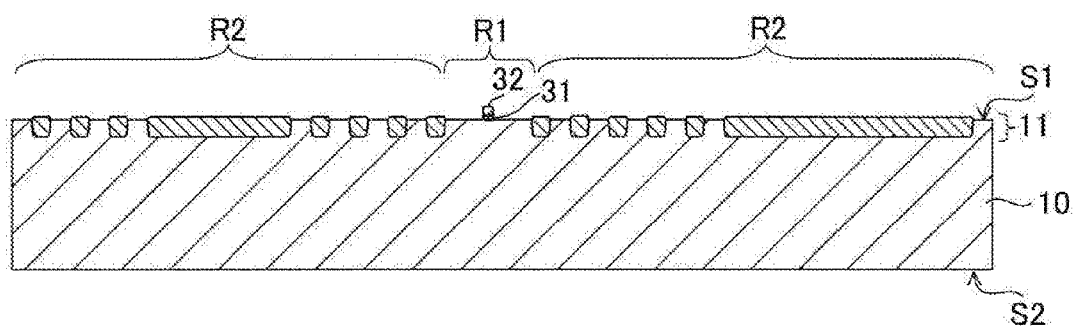
FIG. 4H is a cross-sectional view showing a manufacturing method of a semiconductor device of an embodiment of the present invention.

Next, a gate insulating film 31 is formed on the element forming surface S1 of the semiconductor substrate 10, using a known thermal oxidization method. Thereafter, a polysilicon film for forming the gate is deposited on the gate insulating film 31 using a known CVD method. Then, using known photolithography technique and etching technique, the gate insulating film 31 and the polysilicon film are patterned, thereby forming the gate 32 in the element forming region R1 of the semiconductor substrate 10 (FIG. 4H).

Figure 4I:
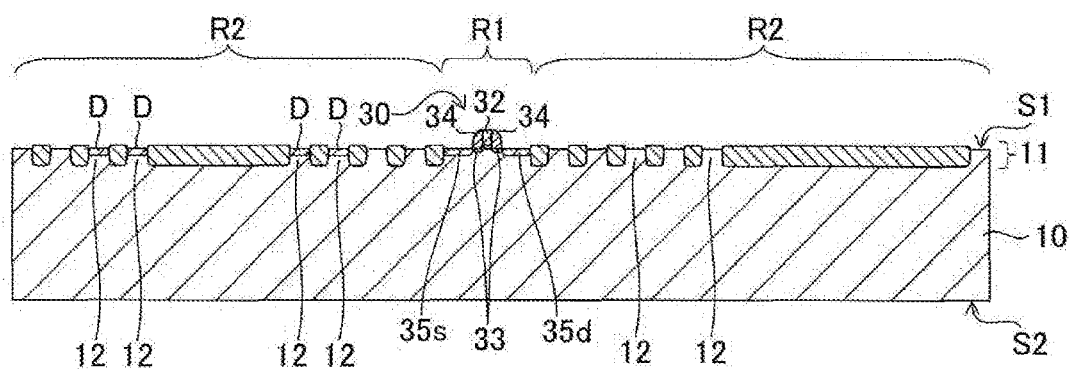
FIG. 4I is a cross-sectional view showing a manufacturing method of a semiconductor device of an embodiment of the present invention.

Next, dopant such as arsenic or boron is doped to the top surface of the element forming surface S1 at a low dose implantation in the element forming region R1 of the semiconductor substrate 10 using known photolithography technique and ion implantation technique, thereby forming an LDD (lightly doped drain) 33. Next, using a known CVD method, a silicon nitride film ($Si_3N_4$) that entirely covers the element forming surface S1 of the semiconductor substrate 10 is formed, and by etching back the silicon nitride film using a known anisotropic etching technique, sidewall spacer 34 covering the side faces of the gate 32 are formed. Next, dopant such as arsenic or boron is doped to the top surface of the element forming surface S1 at a high dose implantation in the element forming region R1 of the semiconductor substrate 10 using known photolithography technique and ion implantation technique, thereby forming a source 35$s$ and a drain 35$d$. In this ion implantation process, the gate 32 and the sidewall spacer 34 function as a part of the mask, and therefore, the source 35$s$ and the drain 35$d$ are formed in a self-alignment process to the gate 32 and the LDD 33. Through those processes, the MOSFET 30 is formed in the element forming region R1 of the semiconductor substrate 10. In the element isolation region R2, the dopant D can be doped into the dummy active regions 12 as well (FIG. 4I).

Figure 4J:
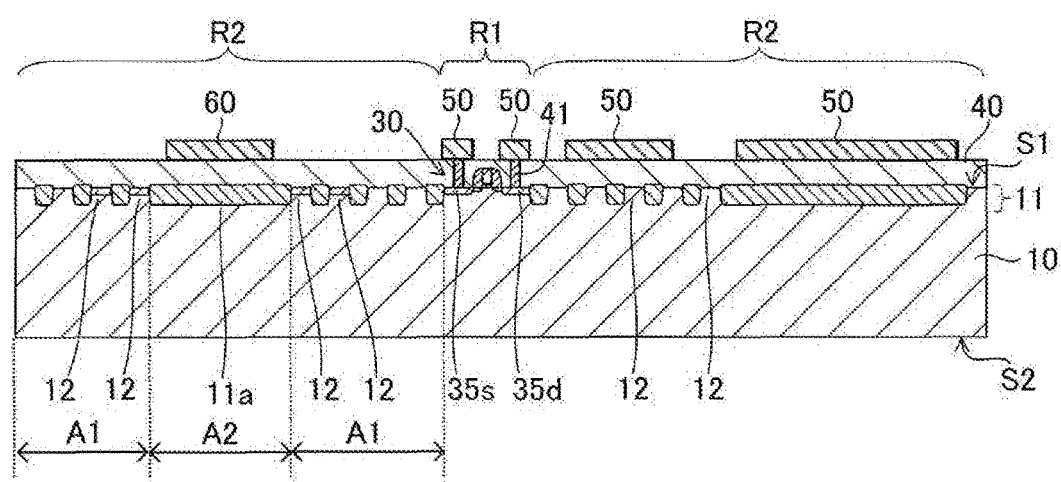
FIG. 4J is a cross-sectional view showing a manufacturing method of a semiconductor device of an embodiment of the present invention.

Next, an insulating film 40 made of an insulator such as $SiO_2$ is formed so as to cover the element forming surface S1 of the semiconductor substrate 10. Next, a via 41 is formed. The via 41 is connected to the source 35s and the drain 35d of the MOSFET 30 formed in the element forming region R1 through the insulating film 40. Next, a conductive film made of a conductor such as A1 is formed on the surface of the insulating film 40, and by patterning this conductive film using known photolithography technique and etching technique, a circuit wiring line connected to the MOSFET 30 or other semiconductor elements (not shown in the figure) formed in the element forming region R1, i.e., the first wiring layer 50, is formed, and the alignment mark 60 is also formed. The alignment mark 60 is formed in an area above the second area A2 covered by the insulator 11a in the insulator layer (field oxide film) 11 formed in the element isolation region R2, and is arranged in a position that does not overlap any of the plurality of dummy active regions 12 (FIG. 4J).

Figure 4K:
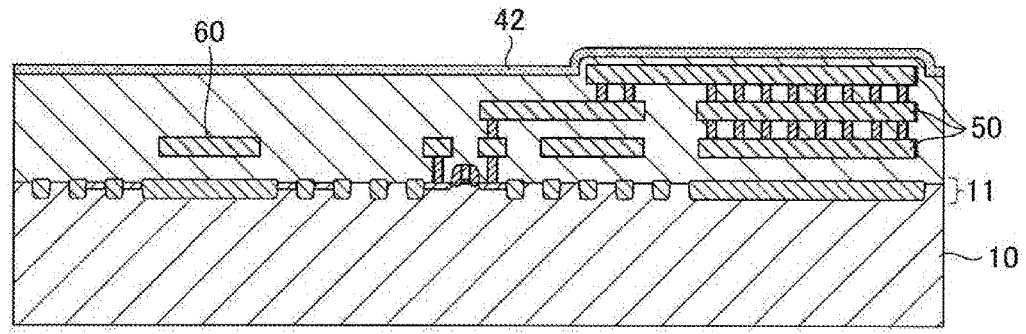
FIG. 4K is a cross-sectional view showing a manufacturing method of a semiconductor device of an embodiment of the present invention.

Next, an insulating film and a wiring layer are alternately stacked on the element forming surface S1 of the semiconductor substrate 10 as necessary, thereby forming a multilayer wiring structure on the element forming surface S1 of the semiconductor substrate 10. Thereafter, a protective film 42 made of an insulator such as a silicon nitride film is formed on the surface of the insulating film 40 (FIG. 4K).

Next, the processes on the rear surface S2 of the semiconductor substrate 10 will be explained with reference to FIGS. 5A to 5K. In FIGS. 5A to 5K, the MOSFET 30 and the dummy active regions 12 formed on the element forming surface S1 are not shown, and the illustration of the first wiring layer 50 is simplified.

Figure 5A:
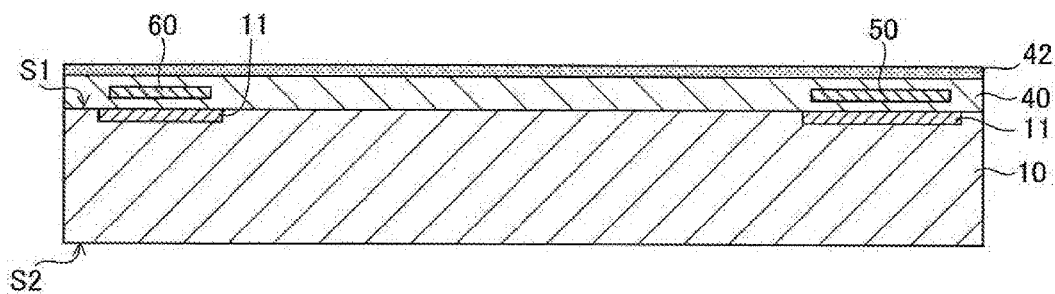
FIG. 5A is a cross-sectional view showing a manufacturing method of a semiconductor device of an embodiment of the present invention.
Figure 5B:
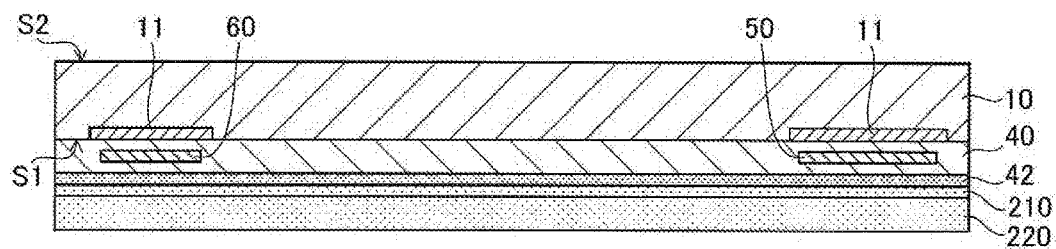
FIG. 5B is a cross-sectional view showing a manufacturing method of a semiconductor device of an embodiment of the present invention.

FIG. 5A shows the semiconductor substrate 10 after the respective processes have been performed on the element forming surface S1. A supporting substrate 220 is attached onto the protective film 42 formed on the element forming surface S1 of the semiconductor substrate 10 using a paste 210. The supporting substrate 220 needs to be made of a material having an enough mechanical strength to support the semiconductor substrate 10, and a glass substrate may be used for the supporting substrate 220, for example. Next, by polishing the rear surface S2 of the semiconductor device 10 using a known back-grinding technique, the semiconductor substrate 10 is thinned to a predetermined thickness (FIG. 5B).

Figure 5C:
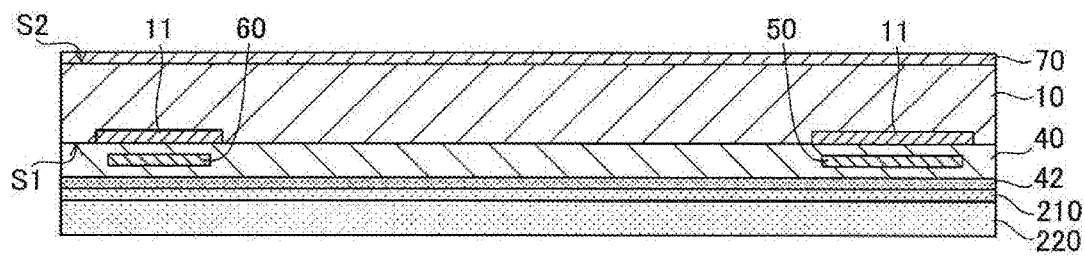
FIG. 5C is a cross-sectional view showing a manufacturing method of a semiconductor device of an embodiment of the present invention.

Next, using a known CVD method, an insulating film 70 made of an insulator such as $SiO_2$ is formed on the rear surface S2 of the semiconductor substrate 10 (FIG. 5C).

Figure 5D:
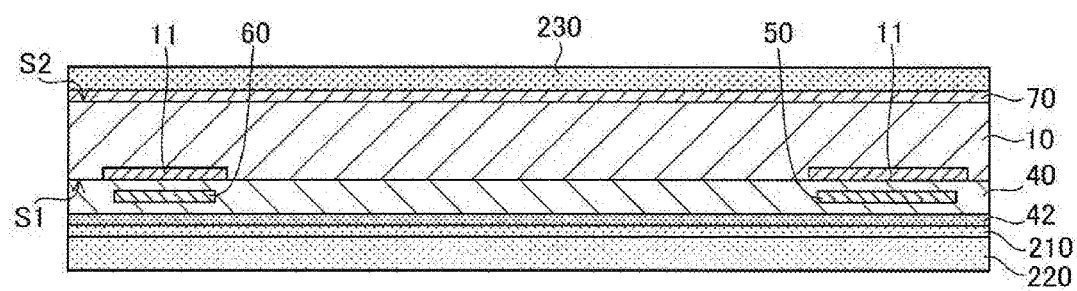
FIG. 5D is a cross-sectional view showing a manufacturing method of a semiconductor device of an embodiment of the present invention.
Figure 5E:
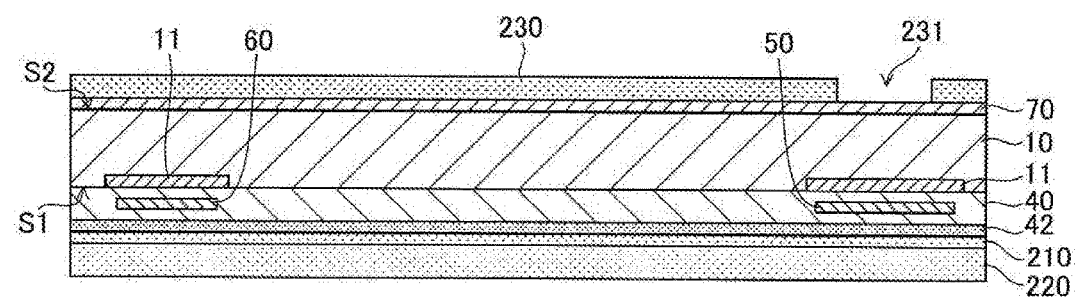
FIG. 5E is a cross-sectional view showing a manufacturing method of a semiconductor device of an embodiment of the present invention.

Next, the surface of the insulating film 70 is coated with a photoresist 230 made of a photosensitive resin (FIG. 5D). Thereafter, using a known photolithography technique, the photoresist 230 is patterned. That is, an opening 231 is formed in the photoresist 230 at a location corresponding to the location of the through-silicon via (FIG. 5E). Specifically, an exposure process is performed on the photoresist 230 through a photo mask corresponding in shape to the opening pattern of the photoresist 230, followed by a development process.

The position of the opening 231 needs to align the first wiring layer 50 formed on the element forming surface 51 of the semiconductor substrate 10. The position of the opening 231 is defined by the position of the photo mask used to form the opening pattern in the photoresist 230. When the position of the photo mask is determined, the alignment mark 60, which is formed on the element forming surface 51 of the semiconductor substrate 10, is used as the reference for positioning. The alignment mark 60 is recognized by receiving a reflected light or transmission light of infrared radiated from a light source installed in a light exposure apparatus from the direction of the rear surface S2 of the semiconductor substrate 10 toward the alignment mark 60. With the manufacturing method of this embodiment, the infrared entering from the rear surface S2 of the semiconductor substrate 10 passes through the second area A2 completely covered by the insulator in the insulator layer 11 formed in the element isolation region R2, instead of the dummy active regions 12 doped with the dopant D. This allows the infrared entering from the rear surface S2 of the semiconductor substrate 10 to reach the alignment mark 60 without being diffused. As a result, the alignment mark 60 can be recognized properly, and the photomask used to form an opening pattern of the photoresist 230 can be arranged in the proper position.

Figure 5F:
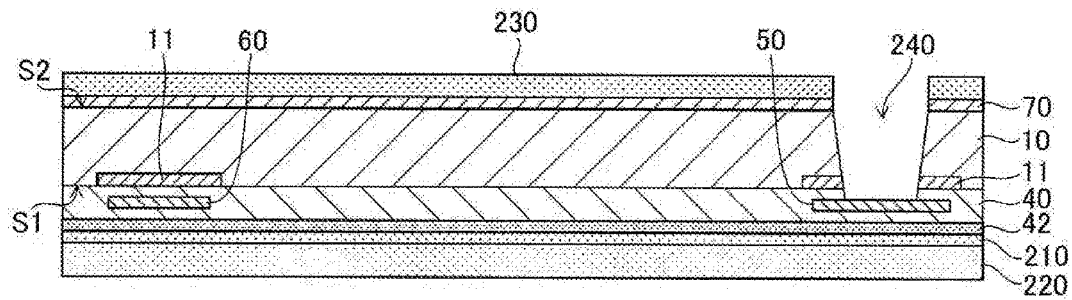
FIG. 5F is a cross-sectional view showing a manufacturing method of a semiconductor device of an embodiment of the present invention.

Next, the rear surface S2 of the semiconductor substrate 10 is etched using the patterned photoresist 230 as a mask, thereby forming a through-hole 240 that reaches the first wiring layer 50 (FIG. 5F).

Figure 5G:
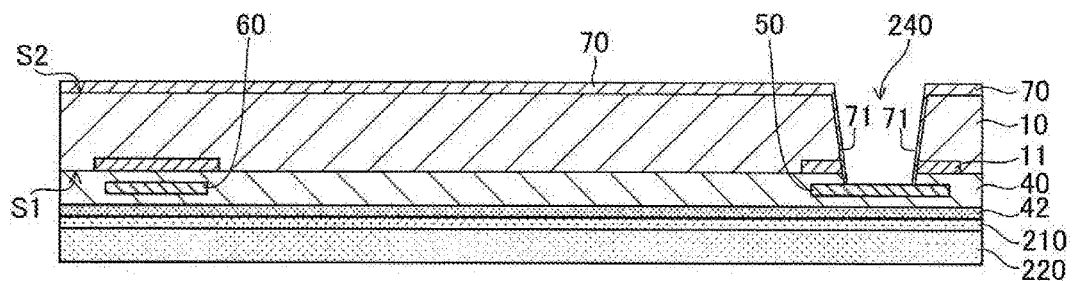
FIG. 5G is a cross-sectional view showing a manufacturing method of a semiconductor device of an embodiment of the present invention.

Next, using a known CVD method, an insulating film 71 made of an insulator such as $SiO_2$ is formed so as to cover the side face and bottom face of the through-hole 240. Next, a part of the insulating film 71 covering the bottom face of the through-hole 240 is removed by etching, so that the first wiring layer 50 is exposed from the bottom face of the through-hole 240 (FIG. 5G).

Figure 5H:
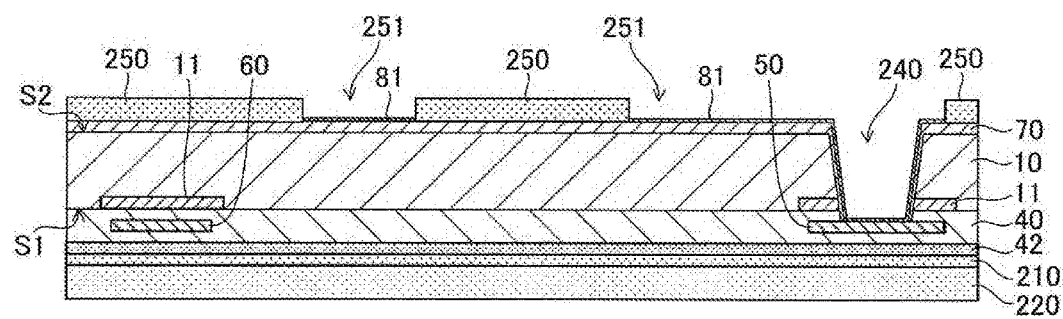
FIG. 5H is a cross-sectional view showing a manufacturing method of a semiconductor device of an embodiment of the present invention.

Next, by a known spattering method, an underlying film 81 that covers the side face and bottom face of the through hole 240 and the rear surface S2 of the semiconductor substrate 10 is formed. The underlying film 81 is comprised of a barrier metal film made of Ti and Ni, and a plating seed film made of Cu. Thereafter, the surface of the underlying film 81 is coated with a photoresist 250, and the photoresist 250 is patterned using a known photolithography technique. That is, in the photoresist 250, an opening 251 corresponding to the wiring pattern of the second wiring layer 90, which is formed on the rear surface S2 of the semiconductor substrate 10, is formed. The alignment mark 60 may be used to determine the position of the photomask used for patterning the photoresist 250. This way, the second wiring layer 90 can be aligned to the first wiring layer 50 (FIG. 5H).

Figure 5I:
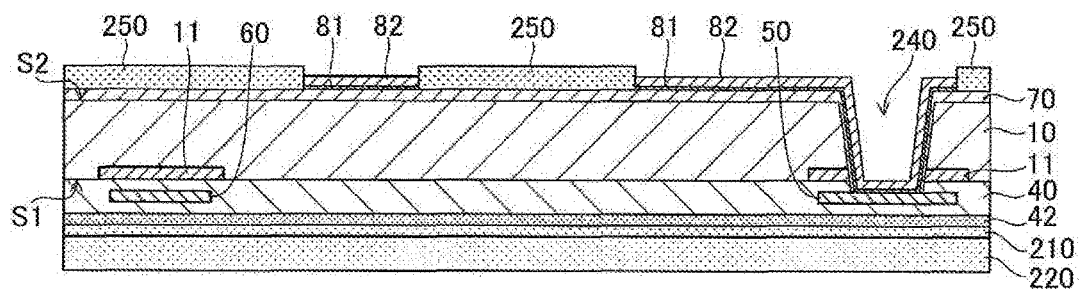
FIG. 5I is a cross-sectional view showing a manufacturing method of a semiconductor device of an embodiment of the present invention.
Figure 5J:
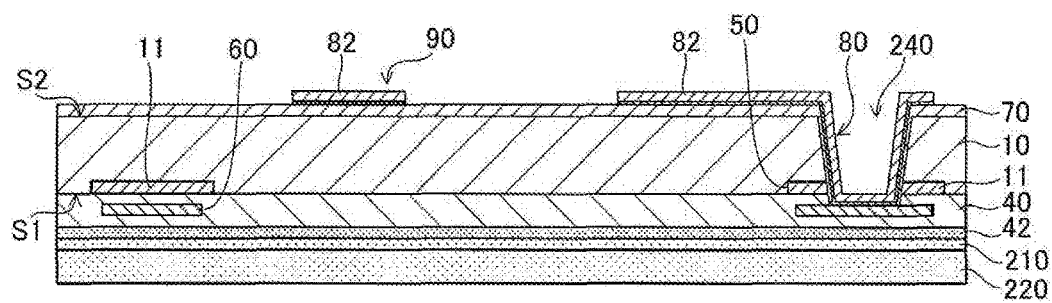
FIG. 5J is a cross-sectional view showing a manufacturing method of a semiconductor device of an embodiment of the present invention.

Next, using the electrolytic plating method, a conductive film 82 made of a conductor such as Cu is formed on the surface of the underlying film 81 exposed from the opening 251 of the photoresist 250 (FIG. 5I). Thereafter, the photoresist 250 is removed (FIG. 5J). The conductive film 82 formed on the side wall and bottom face of the through-hole 240 constitutes the through-silicon via 80. The conductive film 82 formed on the rear surface S2 of the semiconductor substrate 10 constitutes the second wiring layer 90. The through-silicon via 80 is connected to the first wiring layer 50 at the bottom face of the through-hole 240. The second wiring layer 90 is electrically connected to the first wiring layer 50 through the through-silicon via 80.

Figure 5K:
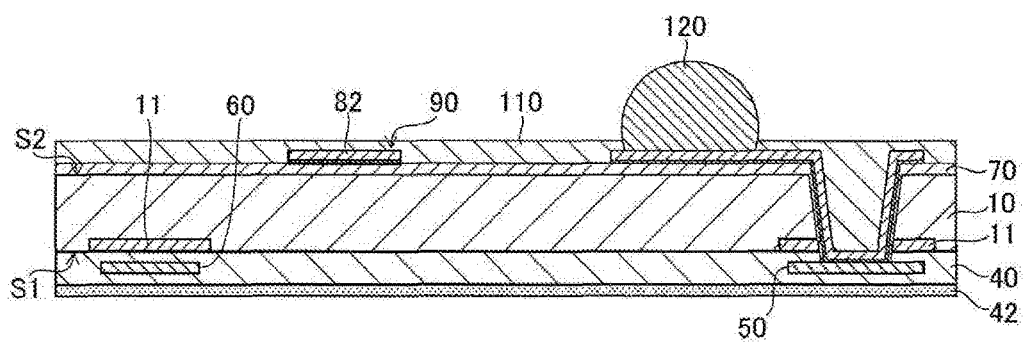
FIG. 5K is a cross-sectional view showing a manufacturing method of a semiconductor device of an embodiment of the present invention.

Next, a solder resist 110 made of a photo-curable epoxy resin is applied on the rear surface S2 of the semiconductor substrate 10 so as to cover the entire surface, and after drying, an exposure process is performed through a photomask, thereby curing the exposed part of the solder resist 110. The through-hole 240 is filled with the solder resist 110. Thereafter, the part of the solder resist 110 that was not exposed to light was selectively removed, thereby forming an opening at the position where a solder bump is to be formed. Next, using the electrolytic plating method, a soldering bump 120 is formed at a pad portion of the second wiring layer 90 exposed from the opening of the solder resist 110 (FIG. 5K).

As apparent from the descriptions above, according to the semiconductor device 1 of an embodiment of the present invention and the manufacturing method thereof, the alignment mark 60 is formed in an area within the second area A2 that is completely covered by the insulator 11a in the insulator layer (field oxide film) 11 formed in the element isolation region R2 and the projection area of the alignment mark 60 in the direction vertical to the primary surfaces of the semiconductor substrate 10 does not overlap any of the plurality of dummy active regions 12. Therefore, the infrared radiated from the direction of the rear surface S2 of the semiconductor substrate 10 in order to recognize the alignment mark 60 passes through the insulator 11a that extends in the second area A2, but does not pass through the dummy active regions 12 doped with the dopant D. This allows the infrared to reach the alignment mark 60 without being diffused. As a result, the occurrence of an error in recognizing the alignment mark 60 can be suppressed, and it is possible to arrange the photomask in a proper position so as to properly align the position of the through-silicon via 80 to the first wiring layer 50.

Also, in the semiconductor device 1 of an embodiment of the present invention and the manufacturing method thereof, the forming position of the alignment mark 60 needs to be taken into consideration only in designing a mask that defines the pattern of the insulator layer (field oxide film) 11 formed in the element isolation region R2. That is, it is not necessary to form a resist in a position corresponding to the alignment mark in every process of dopant implantation, and therefore, the complex mask design can be avoided.

The pattern of the insulator layer (field oxide film) 11 formed in the element isolation region R2 can be observed by an optical microscope and electron microscope, which makes it easy to verify the pattern with a non-destructive test. As a result, even if there is an error in the design of the mask that defines the pattern of the insulator layer 11, it is possible to find the error in the mask design in an early stage of the manufacturing process of the semiconductor device 1. Thus, the problem of prolonged development period due to an error in the mask design can be avoided.

Figure 6:
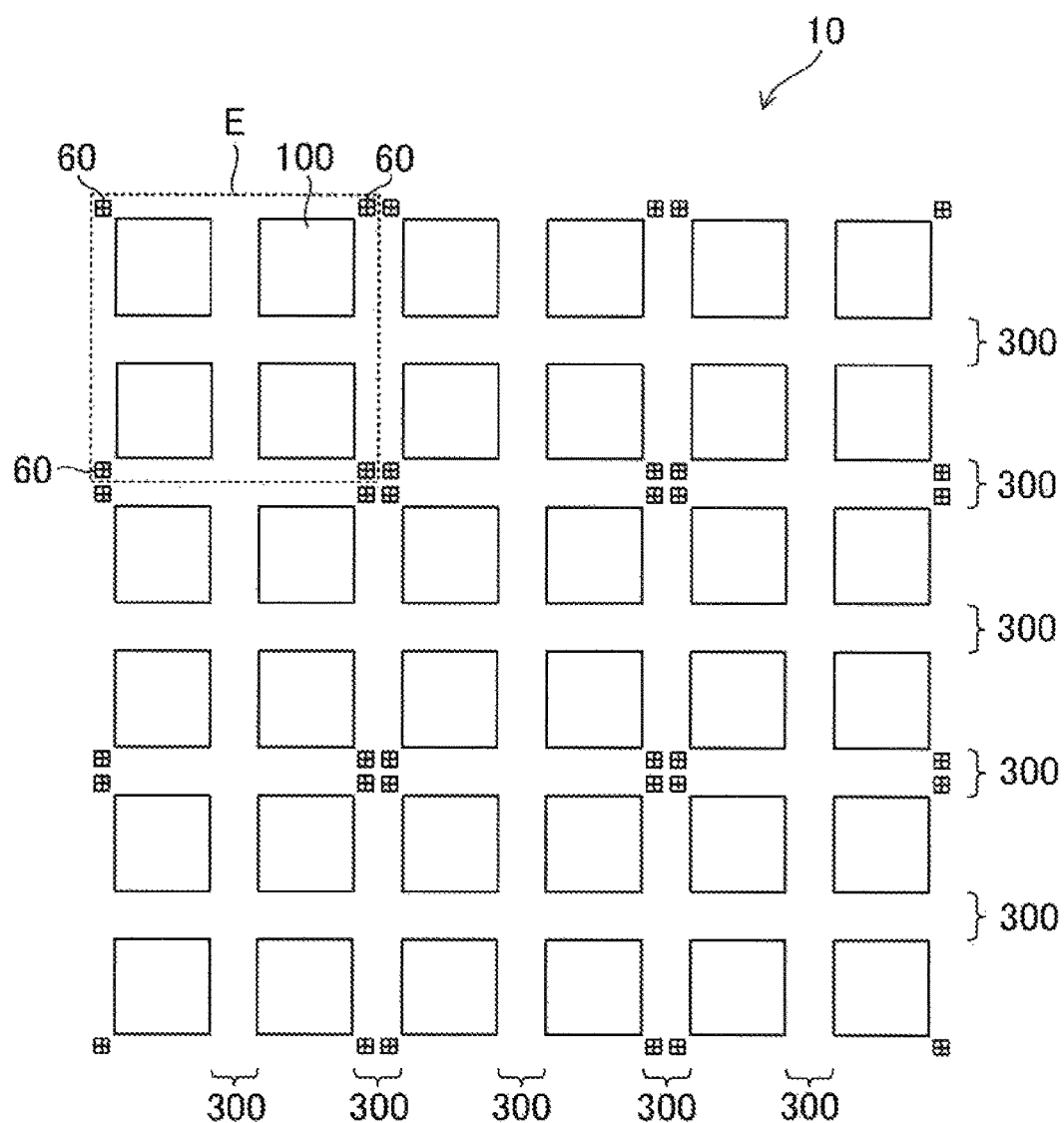
FIG. 6 is a plan view showing an example of the forming position of the alignment mark of an embodiment of the present invention.

FIG. 6 is a plan view showing an example of the forming position of the alignment mark 60 in the semiconductor substrate 10. As shown in FIG. 6, the semiconductor substrate 10 has the configuration of a semiconductor wafer including a plurality of semiconductor chips 100. The semiconductor chips 100 are separated into an individual piece by dicing in the end. A scribe region 300, which is to be cut by the dicing blade in the dicing process, is included in the element isolation region R2. The alignment mark 60 may be formed in the scribe region 300 in the element isolation region R2. In this process, the exposure apparatus performing an exposure process on the resist is configured to gradually move the exposure area E enclosed by the broken line in FIG. 6, thereby performing the exposure process on the entire area of the semiconductor substrate 10. The alignment mark 60 is used to determine the position of the photomask in the exposure process. Thus, as shown in FIG. 6, it is also possible to have one or a plurality of alignment marks 60 for each part of the exposure area E for one shot of the exposure apparatus.

Embodiment 2

Figure 7:
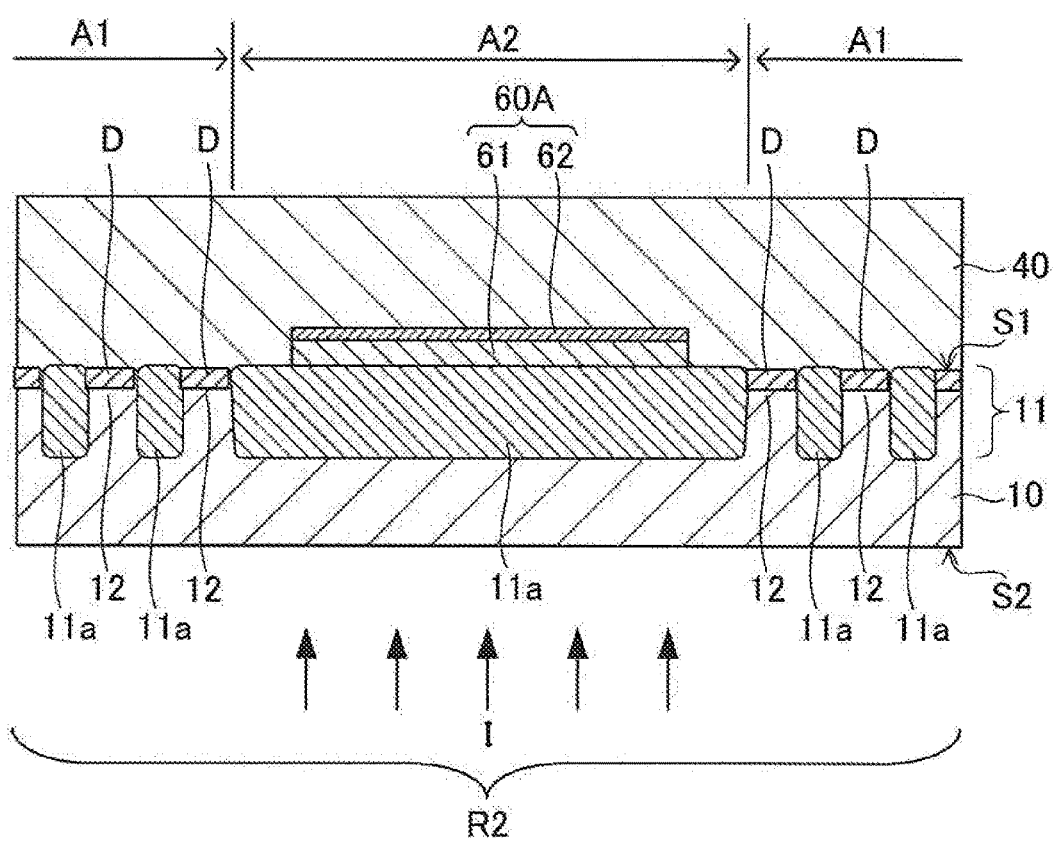
FIG. 7 is a cross-sectional view showing the configuration of an alignment mark in another embodiment of the present invention.

FIG. 7 is a cross-sectional view showing the configuration of an alignment mark 60A according to Embodiment 2 of the present invention. In Embodiment 1 described above, the alignment mark was formed in the layer where the first wiring layer 50 is formed, and was made of the same material as that of the first wiring layer 50. On the other hand, the alignment mark 60A of Embodiment 2 is made of a polysilicon film 61 that has a metal silicide layer 62 on the surface thereof, the polysilicon film 61 being formed on the insulator 11a that forms the insulator layer (field oxide film) 11. The metal silicide layer 62 can be formed by depositing a metal such as cobalt, nickel, or titanium on the polysilicon film 61, and performing a thermal treatment process. The polysilicon film 61 can be formed in the same process as the process to form the gate 32 of the MOSFET 30 formed in the element forming region R1.

The alignment mark 60A is formed in an area within the second area A2 covered by the insulator in the insulator layer (field oxide film) 11 formed in the element isolation region R2, and in a top view, the alignment mark 60A is arranged in a position that does not overlap any of the plurality of dummy active regions 12. Therefore, the infrared radiated from the direction of the rear surface S2 of the semiconductor substrate 10 in order to recognize the alignment mark 60A passes through the insulator 11a that extends in the second area A2, not the dummy active regions 12 doped with the dopant D. This allows the infrared to reach the alignment mark 60A without being diffused. As a result, the occurrence of an error in recognizing the alignment mark 60A can be suppressed, and it is possible to arrange the photomask in a proper position so as to properly align the position of the through-silicon via 80 to the first wiring layer 50.

What is claimed is:

1. A semiconductor device, comprising:
   a semiconductor substrate having a primary surface;
   an insulator filling a recess in the primary surface;
   a semiconductor element disposed on the primary surface, the semiconductor element being sandwiched by the insulator in a plan view; and
   an alignment mark overlapping with the insulator in a plan view,
   wherein a distance between a bottom surface and a top surface of the insulator that sandwiches the semiconductor element in a plan view is equal to a distance between a bottom surface and a top surface of the insulator overlapping the alignment mark in a plan view.

2. The semiconductor device according to claim 1, wherein the semiconductor element includes a gate electrode, and
   wherein the alignment mark is formed in the same layer as the gate electrode.

3. The semiconductor device according to claim 1, further comprising a first wiring layer formed above the primary surface having an insulating layer therebetween,
   wherein the alignment mark is formed in the same layer as the first wiring layer.

4. The semiconductor device according to claim 1, wherein the semiconductor substrate has a rear surface that faces the primary surface,
   wherein a second wiring layer is formed above the rear surface having an insulating layer therebetween, and
   wherein the second wiring layer is connected to a first wiring layer formed above the primary surface through a via electrode that runs through the semiconductor substrate.

* * * * *